(12) United States Patent
Winters et al.

(10) Patent No.: US 7,190,122 B2
(45) Date of Patent: Mar. 13, 2007

(54) OLED DISPLAY WITH IMPROVED ACTIVE MATRIX CIRCUITRY

(75) Inventors: Dustin L. Winters, Webster, NY (US); John E. Ludwicki, Churchville, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/069,652

(22) Filed: Mar. 1, 2005

(65) Prior Publication Data

US 2006/0197458 A1    Sep. 7, 2006

(51) Int. Cl.
  *G09G 3/10* (2006.01)
(52) U.S. Cl. ............................. 315/169.1; 315/169.3; 345/83; 345/92; 313/500; 257/72
(58) Field of Classification Search ............. 315/169.1, 315/169.3; 345/76, 77, 80, 83, 84, 92; 313/500, 313/505; 257/72, E27.117
See application file for complete search history.

(56) References Cited

U.S. PATENT DOCUMENTS

| | | | |
|---|---|---|---|
| 4,356,429 A | 10/1982 | Tang | 313/503 |
| 5,550,066 A | 8/1996 | Tang et al. | 438/29 |
| 6,281,634 B1 | 8/2001 | Yokoyama | 315/169.3 |
| 6,456,013 B1 | 9/2002 | Komiya et al. | 315/169.1 |
| 6,522,079 B1 | 2/2003 | Yamada | 315/169.3 |
| 6,531,815 B1 | 3/2003 | Okuyama et al. | 313/506 |
| 6,583,577 B1 | 6/2003 | Choi et al. | 315/169.3 |
| 6,771,028 B1 | 8/2004 | Winters | 315/169.1 |
| 6,798,145 B2 | 9/2004 | Ishizuka | 315/169.1 |
| 6,909,233 B2 * | 6/2005 | Cok et al. | 313/506 |
| 2002/0186214 A1 | 12/2002 | Siwinski | |
| 2004/0113875 A1 | 6/2004 | Miller et al. | |
| 2004/0125101 A1 | 7/2004 | Choi et al. | |
| 2004/0195963 A1 | 10/2004 | Choi et al. | |
| 2004/0201558 A1 | 10/2004 | Arnold et al. | |
| 2005/0040756 A1 * | 2/2005 | Winters et al. | 313/504 |
| 2006/0038752 A1 * | 2/2006 | Winters | 345/76 |
| 2006/0050032 A1 * | 3/2006 | Gunner et al. | 345/82 |

* cited by examiner

*Primary Examiner*—Haissa Philogene
(74) *Attorney, Agent, or Firm*—Raymond L. Owens

(57) ABSTRACT

An OLED display for producing a multicolor image includes a plurality of pixels including three different colored addressable gamut-pixels and a fourth addressable within-gamut-pixel, each pixel having a separately addressable organic light-emitting diode with first and second electrodes and one or more organic light emissive layers provided between the electrodes; active matrix circuitry including a separate power transistor for at least two of the three different colored addressable gamut-pixels for regulating current between a first and second voltage source through the organic light-emitting diode of the colored addressable gamut-pixel; and the active matrix circuitry including a power transistor for the fourth addressable within-gamut-pixel for regulating current between a third and fourth voltage source through the organic light-emitting diode of the fourth addressable within-gamut-pixel wherein at least three of the first, second, third, and fourth voltage sources provide different voltage levels.

17 Claims, 5 Drawing Sheets

OLED DISPLAY WITH IMPROVED ACTIVE MATRIX CIRCUITRY

FIELD OF INVENTION

This invention relates to active matrix circuitry for driving pixels in an OLED display.

BACKGROUND OF THE INVENTION

In the simplest form, an organic electroluminescent (EL) device is comprised of an organic electroluminescent media disposed between first and second electrodes serving as an anode for hole injection and a cathode for electron injection. The organic electroluminescent media supports recombination of holes and electrons that yields emission of light. These devices are also commonly referred to as organic light-emitting diodes, or OLEDs. A basic organic EL element is described in U.S. Pat. No. 4,356,429. In order to construct a pixelated OLED display that is useful as a display such as, for example, a television, computer monitor, cell phone display, or digital camera display, individual organic EL elements can be arranged as pixels in a matrix pattern. These pixels can all be made to emit the same color, thereby producing a monochromatic display, or they can be made to produce multiple colors such as a three-pixel red, green, blue (RGB) display. For purposes of this disclosure, a pixel is considered the smallest individual unit, which can be independently stimulated to produce light. As such, the red pixel, the green pixel, and the blue pixel are considered as three distinct pixels.

Color OLED displays have also recently been described that are constructed as to have four differently colored pixels. One type of OLED display having four differently colored pixels that are red, green, blue, and white in color is known as an RGBW design. Examples of such four pixel displays are shown in U.S. Pat. No. 6,771,028, U.S. Patent Application Publications 2002/0186214 A1, 2004/0113875 A1, and 2004/0201558 A1. Such RGBW displays can be constructed using a white organic EL emitting layer with red, green, and blue color filters for the red, green, and blue pixels, respectively. The white pixel area is left unfiltered. This design has the advantage that the organic electroluminescent media does not require patterning between the differently colored pixels, thereby simplifying the manufacturing process. Furthermore, inclusion of the unfiltered white pixel allows for the display of colors that are less than fully saturated at reduced power consumption compared to similar RGB displays having a white organic EL emitting layer with red, green, and blue filters for the red, green, and blue pixels, respectively.

OLED displays driven with active matrix circuitry have also been shown. Active matrix circuitry typically includes active circuit components such as multiple transistors and one or more capacitors per pixel as well as signal lines such as data, scan, and power lines, which are shared by the pixels of a row or column. Each pixel in an active matrix OLED display is provided with at least one power transistor. A power transistor regulates the current flow to the pixel's organic EL element in response to a data signal provided on a data line. The power transistor draws current from a power line, which is electrically connected to a voltage source. This current is passed to the first electrode and the organic EL media of the pixel's organic EL element. The second electrode, which is disposed above the organic EL media and the active matrix circuitry, is then electrically connected to a second voltage source, which completes the current path.

Examples of organic EL displays driven by active matrix circuitry are shown in U.S. Pat. Nos. 5,550,066, 6,281,634, and 6,456,013.

However, OLED displays driven by active matrix circuitry require that the voltage difference between the voltage source electrically connected to the power line and the voltage source electrically connected to the second electrode be sufficient to power all the pixels connected to said power line at their highest level of intensity. This voltage difference, or drop, is split between the organic EL element and the at least one power transistor. Therefore, when one or more pixels are at times operated at a lower level of intensity, the supplied voltage is more than is required. In this case, the percentage of the voltage drop across the one or more power transistors in these pixels is increased. Since power consumption is a function of the current flow and the voltage drop, this extra voltage drop results in poor power efficiency.

Active matrix OLED displays have been shown where differently colored pixels are connected to the same power line, e.g. U.S. Pat. No. 6,456,013. Also, active matrix OLED displays have been shown where adjacent columns of pixels share the same power line in U.S. Pat. No. 6,522,079. Similarly, examples where the same power line is shared by pixels of differing colors or pixels in adjacent rows for an RGBW type active matrix display are shown in U.S. Pat. No. 6,771,028. However, if the differently colored pixels connected to a power line also differ in their required voltage level, this arrangement will also suffer from poor power efficiency.

SUMMARY OF THE INVENTION

It is an object of the present invention to provide an OLED display with improved power efficiency.

This object is achieved by an OLED display for producing a multicolor image, comprising:

a) a plurality of pixels including three different colored addressable gamut-pixels and a fourth addressable within-gamut-pixel, each pixel having a separately addressable organic light-emitting diode with first and second electrodes and one or more organic light emissive layers provided between the electrodes;

b) active matrix circuitry including a separate power transistor for at least two of the three different colored addressable gamut-pixels for regulating current between a first and second voltage source through the organic light-emitting diode of the colored addressable gamut-pixel; and c) the active matrix circuitry including a power transistor for the fourth addressable within-gamut-pixel for regulating current between a third and fourth voltage source through the organic light-emitting diode of the fourth addressable within-gamut-pixel wherein at least three of the first, second, third, and fourth voltage sources provide different voltage levels.

DETAILED DESCRIPTION OF THE INVENTION

Figure 1:
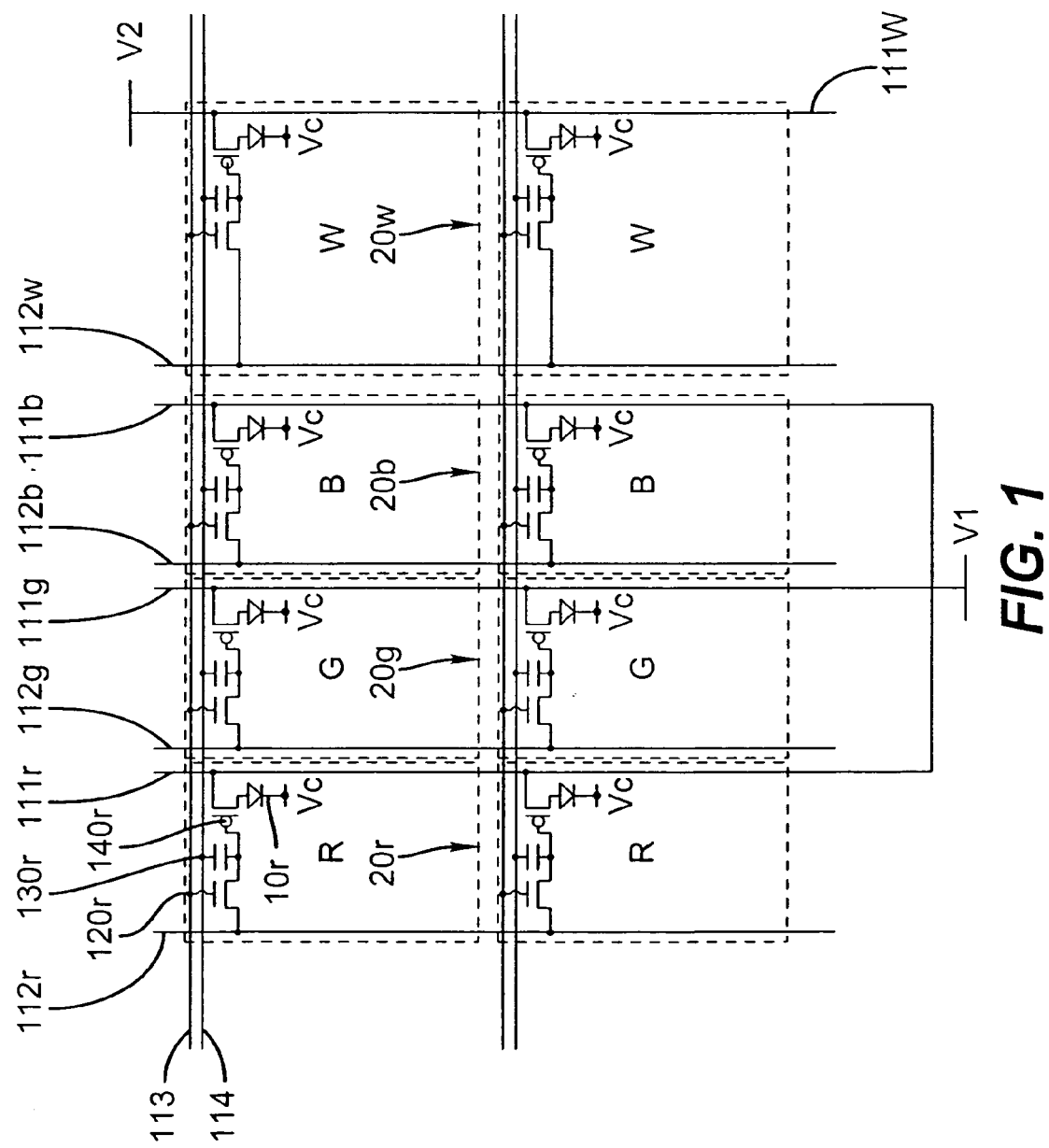
FIG. 1 depicts a circuit layout of the active matrix drive circuitry of a display according to the present invention.

FIG. 1 shows a circuit schematic diagram for the active matrix drive circuitry of an active matrix type OLED display according to the present invention. The display is an RGBW type OLED display having four differently colored pixels. RGBW OLED displays are one example of a type of display that uses within-gamut-pixels to reduce power consumption compared to conventional RGB type displays. Such RGBW OLED display devices are capable of displaying color images through the use of at least four differently color pixels. In an RGBW OLED display, at least three of the differently colored pixels, such as pixel 20r, pixel 20g, and pixel 20b are gamut-pixels that emit different colors, which determine the color gamut of the display. For example, gamut-pixels might emit light that is red, green, or blue in color. In this case, pixel 20r is arranged to emit red light, pixel 20g is arranged to emit green light, and pixel 20b is arranged to emit blue light. Illuminating two or more of the gamut-pixels to varying intensities can produce other colors within the color gamut. These new colors are referred to as within-gamut colors. Such an RGBW OLED display also has at least one additional pixel, such as pixel 20w, that is a within-gamut-pixel, which is arranged to emit a within-gamut color light such as white. The term white is used in the present invention to indicate any light emission that is perceived as approximately white to a viewer. White is the most preferred color for the within-gamut-pixel as it is approximately between the other three gamut-pixel colors. However, the present invention is not limited to a white pixel and other colors which are, for example, more blue, green, red, yellow, pink, or cyan in appearance can be also be employed. These within-gamut-pixels are more efficient than at least one of the gamut-pixels and are typically more efficient than all of the gamut-pixels. Efficiency, which can be measured in (cd/A), is determined as the amount of light emitted from the device per unit of power, which can be measured in, for example, watts (W). Power consumed by the device, in turn, is determined by the current flow required to produce the desired luminance multiplied by the applied voltage drop (V) across the organic light-emitting diode as well as any circuit components electrically connected between the organic light-emitting diode and the voltage source. In an RGBW type display, within-gamut colors can also be displayed by illuminating the within-gamut-pixel in combination with one or more of the gamut-pixels at varying intensities. In this way, the RGBW OLED display can display within-gamut colors with improved power efficiency.

FIG. 1 shows the circuit layout of the active matrix drive circuitry for several rows and columns of pixels. While only a limited number of rows and columns are shown, one skilled in the art can expand this design to a larger plurality of rows and columns. The active matrix drive circuitry is composed of signal lines such as select line 113, capacitor line 114, data line 112r, data line 112g, data line 112b, data line 112w, power line 111r, power line 11g, power line 111b, and power line 111w. These signal lines are common to a row or a column of pixels as shown and are arranged to drive the pixels of the row or column. The active matrix drive circuitry further includes components such as select transistor 120r, power transistor 140r, and storage capacitor 130r, which together with one of more of the signal lines are arranged to drive the organic light-emitting diode 10r of pixel 20r. The other pixels are provided with similar components to drive the respective organic light-emitting diodes of the pixels. A common top electrode connection is connected to the cathodes of all the organic light-emitting diodes to complete the circuit. This common top electrode connection is electrically connected to a voltage source Vc. The present invention, however, is not limited to the case where the top electrode is common. For example, the top electrode can alternately be common to a single column of pixels and each row of pixels can be provided with a different top electrode. These electrodes can be supplied with the same or different voltage levels. Other alternate configurations where individual top electrodes are provided for different rows or where each pixel is provided with its own isolated top electrode can also be practiced.

The term electrical connection is used in this disclosure to indicate connection either directly by way of a conductor or indirectly through a component such as a switch, transistor, diode or the like. Power line 111r, power line 111g, and power line 111b are electrically connected to voltage source V1 and power line 111w is electrically connected to voltage source V2. While the circuit of this example is shown with the organic light-emitting diode arranged in a particular bias with the cathode connected to the common connection and the anode connected to the power transistor, the opposite arrangement can also be employed by one skilled in the art and is included within the scope of the present invention.

The drive circuitry operates in a manner well known in the art. Each row of pixels is selected in turn by applying a voltage signal to the select line associated with the row, such as select line 113, which turns on the select transistor, such as select transistor 120r, for each pixel. The brightness level, or gray scale information, for each pixel is controlled by a voltage signal, which has been set on the data lines, such as data line 112r. The storage capacitor, such as storage capacitor 130r, for each pixel is then charged to the voltage level of the data line associated with that pixel and maintains the data voltage until the row is selected again during the next image frame. The storage capacitor 130r is connected to the gate terminal of the power transistor 140r. Power transistor 140r regulates the current flow through its source and drain terminals and to the organic light-emitting diode 10r in response to the voltage level held on it gate terminal by storage capacitor 130r, thereby controlling the pixel's brightness. Each row is then unselected by applying a voltage signal to the select line, which turns off the select transistors. The data line signal values are then set to the levels desired for the next row and the select line of the next row is turned on. This is repeated for every row of pixels.

As such, select lines are signal lines that serve the function of isolating a row of pixels so that the gray scale information can be loaded into the pixels of the row. Data lines are signal lines that provide the gray scale information to the pixels. This gray scale information can be in the form of a voltage or current signal. Power lines are signal lines that provide a source of electrical power to the organic light-emitting diodes of the pixels for maintaining the brightness level of the pixel, at least during the time when the pixels row is not selected by the select line. Typically, the power lines provide a source of electrical power to the organic light-emitting diode at all times when the pixels are illuminated. Many different alternate types of circuit arrangements known in the art having various arrangements and numbers of circuit components and signal lines are constructed with signal lines serving these basic functions, and the present invention can be practiced on these alternate types of circuit arrangements by one skilled in the art. As such, the present invention is not limited to the specific circuit arrangement shown here. These alternate arrangements include, for example, current mirror type circuits such as shown in U.S. Pat. Nos. 6,091,203, 6,501,466, 6,535,185 and 6,774,877 as well as the pixel circuits shown in U.S. Pat. No. 6,229,506 and the pixel circuit described in U.S. Patent Application Publication 2004/0222746 A1.

V1 and V2 are voltage sources maintained at different levels with respect to the voltage level of voltage source Vc. As previously described, pixel 20w, which is a within-gamut-pixel, is constructed so as to be more efficient than pixel 20r, pixel 20g, or pixel 20b, which are gamut-pixels. Therefore, the magnitude of the voltage drop across the organic light-emitting diode of pixel 20w required to obtain a desired peak brightness is smaller than the magnitude of the voltage drop required across at least one of pixel 20r, pixel 20g, or pixel 20b. OLED devices are not an ideal diode. An ideal diode has no resistance and, as such, can pass infinite current without increasing applied voltage above a turn-on voltage. OLED devices, on the other hand, are known to require higher applied voltage as current density is increased. A more efficient device requires a lower current to achieve comparable brightness. For cases where the within-gamut-pixel has approximately the same emitting area as the gamut-pixels, the within-gamut-pixel will require a lower current density. It can therefore be supplied with a lower magnitude voltage.

It is often desirable to design the display such that the emitting areas of the differently colored pixels are not the same. By adjusting the emitting areas of the differently colored pixels, the current densities used to achieve the desired levels of brightness for each of the differently colored pixels are also adjusted. The luminance efficiency of OLED devices is known to decay with usage and this rate of decay decreases with decreased current density. Therefore, by individually adjusting the emitting areas of one or more of the differently colored pixels, the rate of decay with usage can be adjusted. Therefore, the emitting areas of one or more of the differently colored pixels is preferably adjusted so that the luminance of the differently colored pixels decay at approximately the same rate over the life of the display. Since the colors of the gamut-pixels, also known as saturated colors, occur less frequently in typical images than the colors within the gamut, the within-gamut-pixel usage is typically more frequent than that of the gamut-pixels. Therefore, the emitting area of the within-gamut-pixel is preferably made to be larger than the emitting areas of one or more of the gamut-pixels. This concept of adjusting the emitting areas of the pixels for an RGBW type OLED display is described in U.S. Patent Application Publication 2004/0201558 A1. This further deceases its current density and therefore the required magnitude of supplied voltage. Therefore, by supplying a separate voltage source for within-gamut-pixels according to the present invention, power consumption is further reduced for OLED displays having within-gamut-pixels with emitting areas larger than that of the gamut-pixels.

Therefore, according to the present invention, the magnitude of the voltage applied to the within-gamut-pixel, in this case pixel 20w, which is the magnitude of V2–Vc, is less than the magnitude of the voltage applied to the gamut-pixels, in this case pixel 20r, pixel 20g, and pixel 20b, which is the magnitude of V1–Vc. It is desirable to reduce the number of different voltage levels that need to be supplied to the display. Therefore, it is preferred that the power lines of the gamut-pixels be provided the same voltage level, as shown, even though these pixels can have slightly differing efficiencies. Therefore, only three voltage levels, represented as V1, V2, and Vc need be supplied to the power lines and common top electrode. However, some advantage can still be achieved according to the present invention, if one of the gamut-pixels is provided with yet another voltage level at its associate power line.

Alternate configurations where the top electrodes are not common, as described previously, can be practiced by one skilled in the art. In this case, the multiple voltage levels can alternately be supplied to the multiple top electrodes or to both the multiple top electrodes and to multiple power lines. Such alternate configurations are considered within the scope of the present invention.

A plurality of pixels having the same color, for example red (R), green (G), blue (B) or white (W), can be present in a plurality of rows and columns. It is preferred that all the pixels having the same color be connected the same voltage level. For example, a given column of pixels can include all red pixels and the entire column is therefore preferably connected to the same power line, as shown. Similarly, every fourth column of pixels can include all pixels of the same color. Therefore, the power lines for every fourth column can be connected together as well. The connecting of power lines of differing columns can be achieved by electrically connecting these power lines together with a conductor at one side of the display outside the pixel area, as shown. Since, in the preferred embodiment of the present invention the power lines of all the gamut-pixels are connected to one voltage source and the power lines of the within-gamut-pixels are connected to a second voltage source, two different voltage sources need to be connected to the various power lines. This is preferably achieved by electrically connecting the power lines of plurality of columns of the gamut-pixels together along one side of the display outside of the pixel area and electrically connecting the power lines of the plurality of columns of within-gamut-pixels together along the opposite side of the display outside the pixel area.

Figure 2:
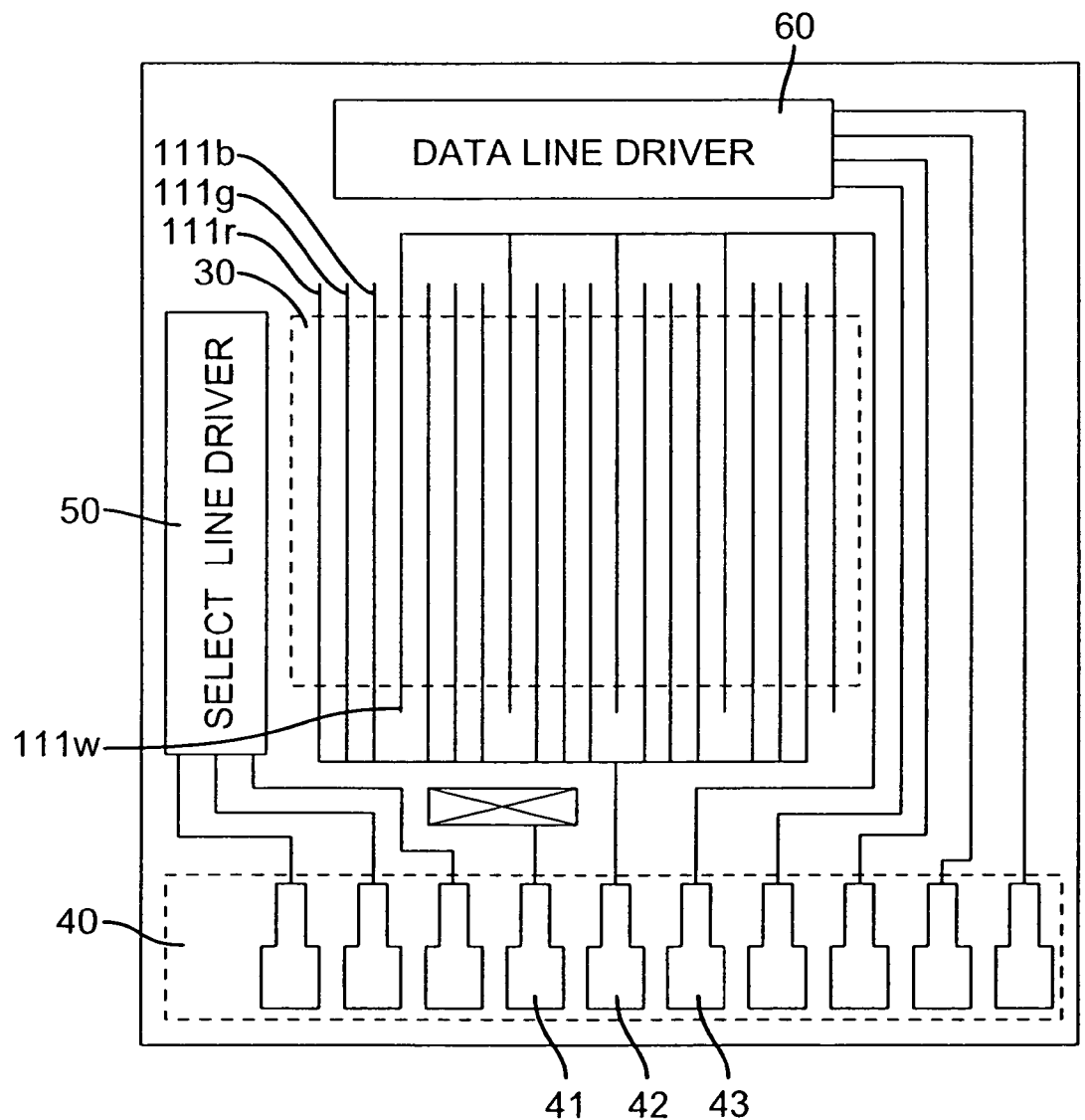
FIG. 2 depicts the layout and wiring of a display according to an embodiment of the present invention.

FIG. 2 shows a conceptual view of a display illustrating the layout and connections of the various parts and sections of a display according one embodiment of the present invention. The display includes a pixel region 30, a connector region 40, a select line driver 50, and a data line driver 60. The select line driver 50 functions to selectively activate the select lines (not shown) for each row as previously described. The data line driver 60 serves to provide data signals to the data lines (not shown) for each column as previously described. The pixel region 30 includes the light-emitting pixels of the display. The regions outside of the pixel region 30 are non-light-emitting regions. The connector region 40 provides a plurality connector pads such a connector pad 41, connector pad 42, and connector pad 43. These connector pads serve as a location for bonding of wires or cables that electrically connect the display to external power sources (not shown) or controlling circuits (not shown). For example, connector pad 41 serves as a connection for voltage source Vc, connector pad 42 serves as a connection for voltage source V1, and connector pad 43 serves as a connection for voltage source V2. It is preferable that the connector pads are all formed along one edge of the display to reduce the size for the non-light-emitting regions of the display as well as simplify the connection process. While, each of the voltages sources can be electrically connected to a single connector pad, multiple connector pads can also be used to provide a low resistance electrical connection to one or more of the voltage sources as described in U.S. Pat. No. 6,531,815.

Connector pad 42 is electrically connected to the power lines of the gamut-pixels such as power line 111r, power line 111g, and power line 111b. This electrical connection is formed on one side of the display out side of the pixel region 30. This can be, for example, the same side of the display as the connector region 40, between the pixel region 30 and the connector region 40, as shown. Connector pad 43 is electrically connected to the power lines of the within-gamut-pixels such as power line 111w. This electrical connection is also formed on one side of the display out side of the pixel region 30. This can be, for example, the same side of the display as the data line driver 60, between the pixel region 30 and the data line driver 60, as shown.

Figure 3:
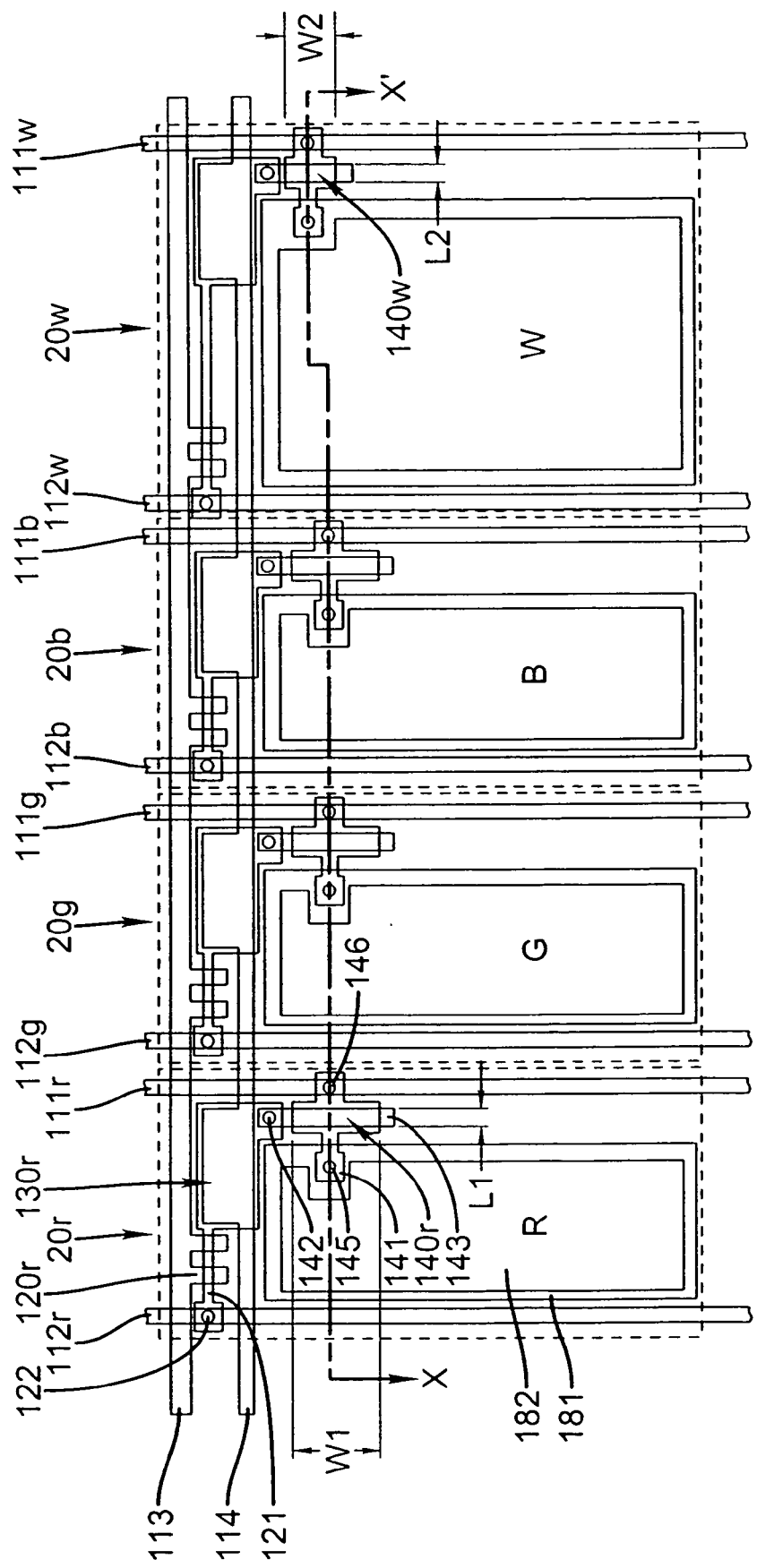
FIG. 3 depicts the construction and layout of the components of the drive circuitry used to drive pixels of a display according the present invention.

A layout diagram for the portions of the drive circuitry used to drive pixel 20r, pixel 20g, pixel 20b, and pixel 20w according to the present invention is shown in FIG. 3. FIG. 3 shows the construction and layout of the various circuit components such as select transistor 120r, storage capacitor 130r, and power transistor 140r. The drive circuitry components are fabricated using known integrated circuit and thin film transistor fabrication technologies. Select transistor 120r is formed from a first semiconductor region 121 using techniques well known in the art. Select transistor 120r is shown as a double gate type transistor, however, this is not required for successful practice of the present invention and a single gate type transistor can also be used. Similarly, power transistor 140r is formed in a second semiconductor region 141. The first semiconductor region 121 and second semiconductor region 141 are preferably formed from the same semiconductor layer. This semiconductor layer is preferably silicon such as polycrystalline or crystalline silicon, but can also be amorphous silicon. Other inorganic and organic semiconducting materials known in the art can also be used. This first semiconductor region 121 also forms one side of storage capacitor 130r. Over the first semiconductor region 121 and second semiconductor region 141, is an insulating layer (not shown) of a material such as silicon nitride that forms the gate insulator of select transistor 120r, the gate insulator for power transistor 140r, and the insulating layer of storage capacitor 130r. The gate of select transistor 120r is formed from part of select line 113, which is formed in the first conductor layer. Power transistor 140r has a separate power transistor gate 143 also preferably formed in the first conductor layer. The other electrode of storage capacitor 130r is formed as part of capacitor line 114, are also preferably formed from the first conductive layer. Power line 111r, power line 111g, power line 111b, power line 111w, data line 111r, data line 111g, data line 111b, and data line 111w are preferably formed from a second conductive layer. One or more of the signal lines, for example select line 113, frequently cross at least one or more of the other signal lines, such as for example data line 112r. As such, these signal lines are preferably fabricated from multiple conductive layers with at least one interlayer insulating layer (not shown) of a material such as silicon nitride disposed in between. The first electrode 181 of the organic light-emitting diode is connected to power transistor 140r. An insulating layer (not shown) of a material such as silicon nitride is located between the first electrode 181 and the second conductive layer.

Connections between layers are formed by etching holes (or vias) in the insulating layers such as via 122 connecting data line 112r to the first semiconductor region 121. Similarly, via 142 connects the power transistor gate 143 to first semiconductor region 121, via 146 connects the second semiconductor region 141 to power line 111r, and the via 145 connects the second semiconductor region 141 to the first electrode 181.

First electrode 181 serves to provide electrical contact to the organic electroluminescent media of the organic light-emitting diodes. Over the perimeter edges first electrode data, an interpixel dielectric layer can be formed to cover the edges of the electrodes and reduce shorting defects as described below. Such interpixel dielectric layers are also described in U.S. Pat. No. 6,246,179. Opening 182 is made in the interpixel dielectric layer over the first electrode 181 to permit the first electrode 181 to make electrical contact with the organic electroluminescent media of the organic light-emitting diode. The emitting area of pixel 20r is defined by the areas of the first electrode 181 that is in electrical contact with the organic electroluminescent media. As such, the emitting area is the area of the first electrode 181 reduced by any area covered by dielectric material. Therefore, when an interpixel is used as described, the emitting area is the area of the opening, such as opening 182, in the interpixel dielectric layer. While use of such an interpixel dielectric layer is preferred, it is not required for successful practice of the present invention.

In a preferred embodiment, color filter elements (not shown) are disposed in the path of the light produced in the emitting areas of the gamut-pixels so as to filter the color of the light prior to reaching the observer. The within-gamut-pixel can optionally be provided with a transparent filler material or a color filter element to slightly modify its color. Alternately, the present invention can also be successfully practiced without providing a transparent filler material or color filter element for the within-gamut-pixel.

In a preferred embodiment of the present invention as shown in FIG. 3, the emitting area of the within-gamut-pixel (pixel 20w) is made to be larger the emitting area of the gamut-pixels (pixel 20r, pixel 20g, and pixel 20b), as previously described. The emitting areas of the gamut-pixels can be made to be approximately the same (as shown) or can also be made to differ from one another. Since OLED devices are not ideal diodes but instead require increased voltage at higher current densities, increasing the emitting area of the within-gamut-pixel relative to the gamut-pixels further reduces the voltage required by the within-gamut-pixel relative to voltage required by the gamut-pixels.

The current supplied to the organic light-emitting diode of each pixel is regulated by the power transistor of that pixel. For example, power transistor 140r regulates the current supplied to the organic light-emitting diode of pixel 20r. It is desirable to reduce the size of the power transistors, in terms of surface area on the substrate, in order to increase the area available for emitting areas or to allow for the pixels to be formed in a greater density or resolution. Each transistor is provided with a channel region, which has a length and a width. The channel region is the area of the semiconductor region covered by the gate electrode. For example, power transistor 140r has a channel region with a width W1 and length L1 as shown. Similarly, power transistor 140w of pixel 20w has a channel region with a width W2 and length L2. Channel length is the dimension of the channel region between the two terminals of the transistor on either side of the transistor's gate. Channel width is the dimension of the channel region perpendicular to the channel length dimension.

The current flow through the power transistor when operated in saturation is given by the following well known equation:

$$I = \frac{\mu \times C'_{ox}}{2} \times \frac{W}{L} \times (V_{GS} - V_{TH})^2 \qquad \text{(Equation 1)}$$

where $\mu$, is the carrier mobility, $C'_{ox}$ is the gate capacitance per unit area, W is the width of the channel region, L is the length of the channel region, $V_{GS}$ is the voltage between the gate and source terminals of the transistor, and $V_{TH}$ is the threshold voltage of the transistor.

During operation, the value of $V_{GS}$ is varied according to the gray scale information received from the data line. However, since the within-gamut-pixel is more efficient than the gamut-pixels, the current required to produce the desired peak brightness from the within-gamut-pixel is less than the current required to produce the desired peak brightness from the gamut-pixels. Therefore, the channel width to channel length ratio (W/L) of the within-gamut-pixel is preferably reduced compared to the to channel length ratio of the gamut-pixels. This can be achieved while retaining the same, or approximately the same, value of $V_{gs}$ needed in order to achieve the desired peak brightness of all the pixels. This can be accomplished, by making the channel width of the within-gamut-pixel, for example W2, smaller than the channel widths of the gamut-pixels, for example W1, as shown. This, in turn, results in the power transistor of the within-gamut-pixel being reduced in size relative to the power transistors of the gamut-pixels.

Furthermore, a data voltage source (not shown) is used to produce the gray scale information applied to the data line. In the case when the data signal is provided in the form of a voltage signal, the intermediate gray scale levels are represented by intermediate voltage levels produced from this data voltage source. If all gamut-pixels and within-gamut-pixels had the same channel width to channel length ratios, more intermediate voltage levels would need to be produced from this data voltage source in order to accommodate all the intermediate voltage levels for each gray scale level of each pixel. In this case, the within-gamut-pixel would use only a portion of the available intermediate voltage levels. However, by constructing the device such that the channel width to channel length ratio of the within-gamut-pixel is less than the channel width to channel length ratio of the gamut-pixels, the number of intermediate voltage levels can be reduced to achieve the same number of gray scale levels for all the pixels. In a preferred construction, the same voltage levels for the within-gamut-pixel and one or more gamut-pixels are used by adjusting the channel width to channel length ratios appropriately.

Finally, by constructing the device such that the channel width to channel length ratio of the within-gamut-pixel is less than channel length ratio of the gamut-pixels, the effect of noise in the gray scale information supplied to the within-gamut-pixel is reduced since the voltage level required to achieve the peak desired brightness is increased. In this way, the magnitude of noise in the form of variability in the voltage signal supplied to the power transistor is reduced compared to the magnitude of the data signal itself.

All the gamut-pixels can be made to have the same channel width to channel length ratios or these can vary from one another as well and still obtain one or more of these advantages. In the example shown in FIG. 3, L1 and L2 are made to be approximately the same while W1 and W2 are made to be different. However, other examples where the lengths can be made to differ while the widths are made to be the same or both the lengths and widths differ can also be employed.

Figure 4:
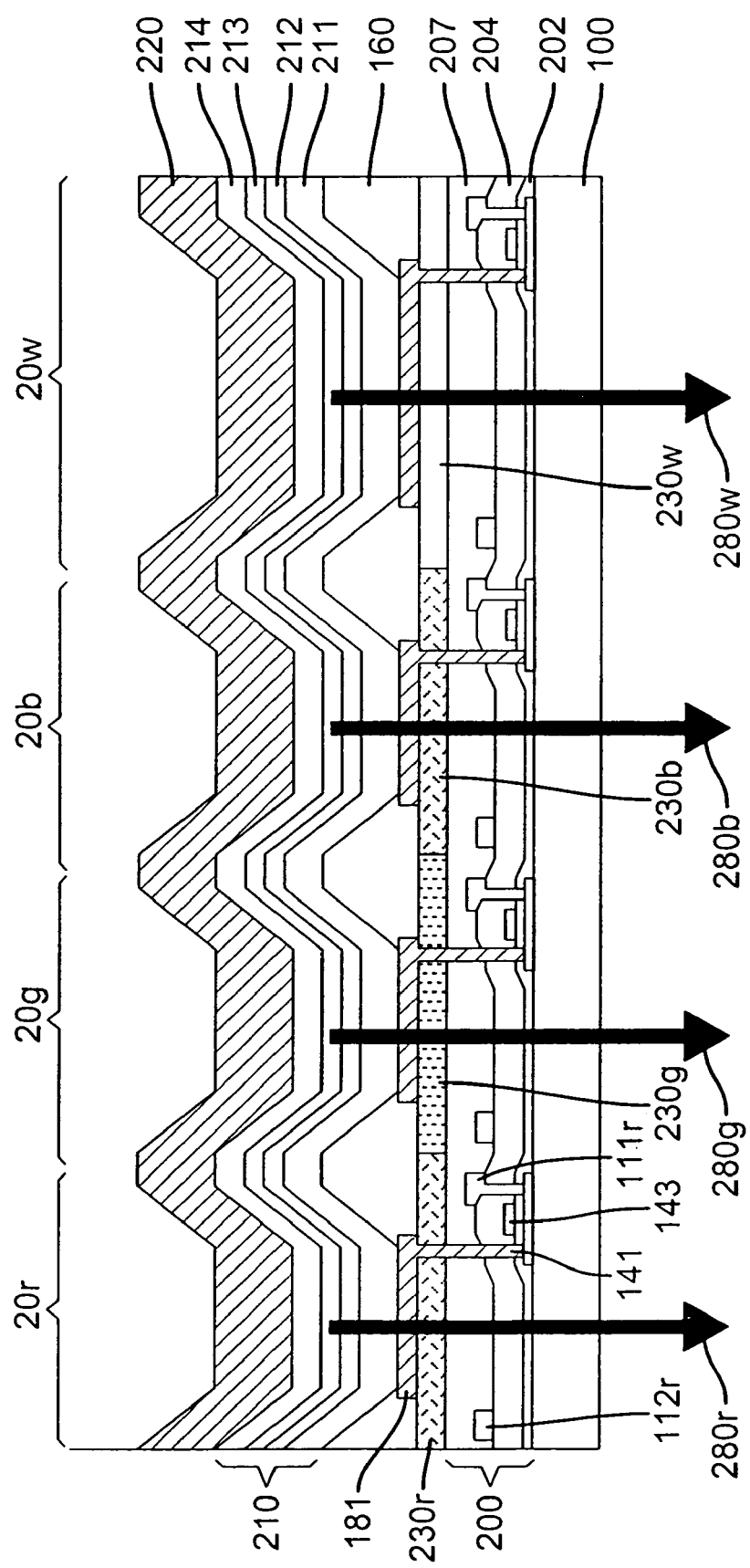
FIG. 4 depicts a cross sectional view along line X–X' of the display of FIG. 3.

A cross-sectional view illustrating the vertical arrangement of the various layers of the OLED display of FIG. 3 along line X–X' is shown in FIG. 4. From FIG. 4, it can be seen that pixel 20r, pixel 20g, pixel 20b, and pixel 20w are formed above substrate 100. When electrically stimulated, these pixels produce light emission 280r, 280g, 280b and 280w respectively. Active matrix circuitry layers 200, including insulating layer 202, insulating layer 204, and insulating layer 207 are shown. The formation of the interpixel dielectric layer 160 over the edges of the first electrodes, such as first electrode 181, can also be seen. In the case where light is viewed through the substrate, as shown, these first electrodes are preferably constructed of a material that is highly transparent such as indium tin oxide. However, the present invention is not limited to this configuration, and devices can be constructed which emit in the opposite direction. In this case, the first electrodes are preferably constructed of a material, which is reflective such as aluminum or silver.

Each of the pixels further includes a portion of organic EL media 210. There are numerous configurations of the organic EL media 210 layers wherein the present invention can be successfully practiced. For the organic EL media, a broadband or white light source that emits light at the wavelengths used by all the pixels can be used to avoid the need for patterning the organic EL media between pixels. In this case, color filters elements, such as color filter element 230r, color filter element 230g, and color filter element 230b, are provided for the gamut-pixels in the path of the light to produce the desired light colors from the white or broadband emission for a multi-color display. Pixels that are to emit the same white or broadband emission as the organic EL media, such as pixel 20w, can remain unfiltered. In this case, a transparent filler 230w can optionally be provided in place of a color filter element. Some examples of organic EL media layers that emit broadband or white light are described, for example, in U.S. Pat. No. 6,696,177. However, the present invention can also be made to work where each pixel has one or more of the organic EL media layers separately patterned for each pixel to emit differing colors for specific pixels. The organic EL media 210 is constructed of several layers such as; a hole injecting layer 211, a hole transporting layer 212 that is disposed over the hole injecting layer 211, a light-emitting layer 213 disposed over the hole transporting layer 212, and an electron transporting layer 214 disposed over the light-emitting layer 213. Alternate constructions of the organic EL media 210 having fewer or more layers can also be used to successfully practice the present invention. Organic EL media layers applied in the opposite order are also known in the art and can be applied to the present invention. These organic EL media layers include organic materials that are either small molecule materials or polymer materials as is known in the art. These organic EL media layers can be deposited by one or more of several methods known in the art such as, for example, thermal evaporation in a vacuum chamber, laser transfer from a donor substrate, or deposition from a solvent by spin coating or use of an ink jet print apparatus.

Above the organic EL media 210, a second electrode 220 is formed. For a configuration where the light is viewed through the substrate, as shown, this electrode is preferably highly reflective and can be composed of a metal such as aluminum or silver or magnesium silver alloy. However, in an alternate embodiment where the light is viewed in the opposite direction, this electrode should be highly transparent and constructed of thin metals, such as silver with a thickness less than 25 nm, or transparent conductive oxides such as indium tin oxide, or combinations thereof. The second electrode 220 can also include an electron injecting layer (not shown) composed of a material such as lithium to aid in the injection of electrons. When a region of organic EL media 210 is stimulated by an electrical current between a first electrode, such as first electrode 181, and second electrode 220, the region of organic EL media 210 produces light emission.

Most OLED displays are sensitive to moisture or oxygen, or both, so they are commonly sealed with an encapsulating means (not shown) in an inert atmosphere such as nitrogen or argon using metal or glass covers, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation and can be applied to the present invention by one skilled in the art.

The examples described in FIG. 1 and FIG. 3 show the pixels arranged in a stripe pattern. A stripe pattern has the pixels of the same color aligned in the same column or row. However, the present invention is not limited to this case and alternate patterns where different colored pixels are arranged in the same columns or same rows can also be applied to the present invention. One pixel arrangement pattern that is particularly useful is a quad pattern where the four differently colored pixels are arranged in a rectangular fashion involving two rows and two columns. Quad patterns are advantageous in that the all four differently colored pixels are close to each other, thereby reducing the perception of band defects when one or more of the pixels are not illuminated in an image or portion of an image.

Figure 5:
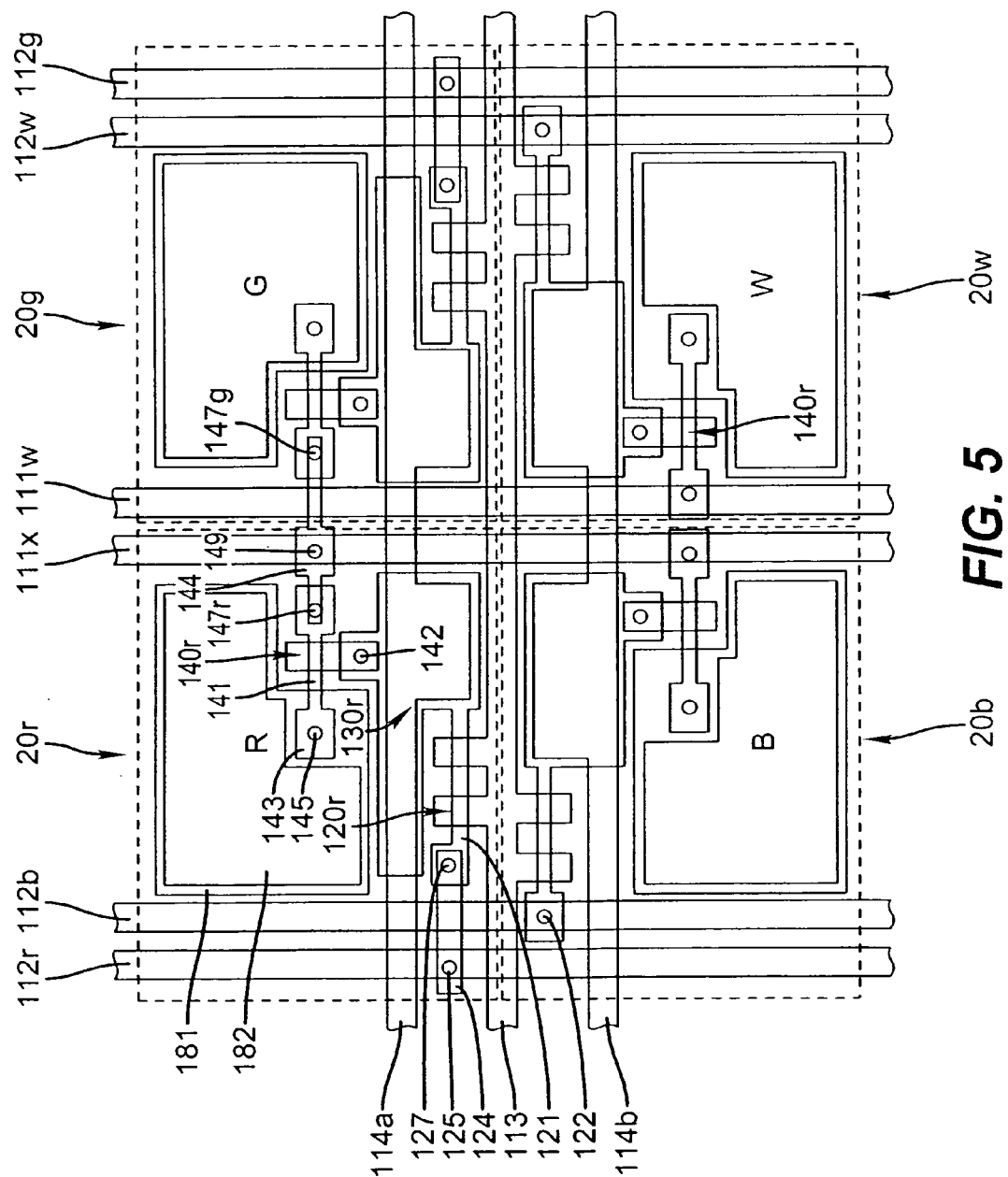
FIG. 5 depicts the construction and layout of the components of the drive circuitry used to drive pixels of a display according another embodiment of the present invention.

A layout diagram for the portions of drive circuitry used to drive a quad pattern arrangement of three gamut-pixels, including pixel 20r, pixel 20g, and pixel 20b, and one within-gamut-pixel, pixel 20w according to an alternate embodiment of the present invention is shown in FIG. 5. Pixel 20r, pixel 20g, pixel 20b, and pixel 20w can be constructed to emit red (R) light, green (G) light, blue (B) light, and (W) light, respectively. However, the present invention is not limited to these specific colors and other colors can also be applied to the present invention by one skilled in the art.

In order to provide a source of electric power to pixel 20r, pixel 20g, pixel 20b, and pixel 20w, two different power lines are provided including power line 111x and power line 111w. As in previous examples, the within-gamut-pixel, which is pixel 20w, is electrically connected to power line 111w. Specifically, power transistor 140w is electrically connected to power line 111w by way of a via as shown. In this alternate embodiment, the gamut-pixels, such as pixel 20r, pixel 20g, and pixel 20b are connected to power line 111x. Power line 111w and power line 111x are electrically connected to two different voltage sources (not shown) so that the magnitude of the voltage applied to the within-gamut-pixel is reduced compared to that of the gamut-pixels connected to power line 111x.

In order to allow power line 111x to be connected to pixel 20g, power line 111w should be crossed. This is preferably accomplished by conductive bridge 144 that is constructed in a different conductor layer than that of the power lines and is connected to power line 111x through via 149 and to the power transistors of the pixels by via 147r and via 147g. It is preferable that the conductive bridge 144 be constructed in the same conductor layer as the select lines. Similarly, a connection should be made between data line 112r and select transistor 120r which crosses data line 112b. This is achieved using conductive bridge 124, which electrically connects to data line 112r by way of via 125 and to select transistor 120r by way of via 127. Conductive bridge 124 is constructed in a different conductor layer than the data lines, preferably the same conductor layer as the select lines. A similar conductor bridge is provided for pixel 20g as shown.

Since this arrangement provides only two power lines for the four differently colored pixels compared to the four shown for the stripe pattern of FIG. 3, the space occupied on the substrate by the power lines is reduced. Therefore, the pixels can packed more densely, thereby enabling higher resolution displays. Also, particularly for the case where light is viewed through the substrate, the resolution can alternately be kept constant, and the size of the emitting areas of the pixels can be increased.

The invention has been described in detail with particular reference to certain preferred embodiments thereof, but it will be understood that variations and modifications can be effected within the spirit and scope of the invention.

PARTS LIST 10b light-emitting diode
10g light-emitting diode
10r light-emitting diode
10w light-emitting diode
20b pixel
20g pixel
20r pixel
20w pixel
30 pixel region
40 connector region
41 connector pad
42 connector pad
43 connector pad
50 select line driver
60 data line driver
100 substrate
111b power line
111g power line
111r power line
111w power line
111x power line
112b data line
112g data line
112r data line
112w data line
113 select line
114 capacitor line
120r select transistor
121 first semiconductor region

PARTS LIST (CON'T)

122 via
124 conductive bridge
125 via
127 via
130r storage capacitor
140r power transistor
140w power transistor 141 second semiconductor region
142 via
143 power transistor gate
144 conductive bridge
145 via
146 via
147g via
147r via
149 via
160 interpixel dielectric layer
181 first electrode
182 opening
200 active matrix circuitry layers
202 insulating layer
204 insulating layer
207 insulating layer
210 organic EL media
211 hole injecting layer
212 hole transporting layer
213 light-emitting layer
214 electron transporting layer
220 second electrode

PARTS LIST (CON'T)

230r color filter element
230g color filter element
230b color filter element
230w transparent filler
280b light emission
280g light emission
280r light emission
280w light emission

The invention claimed is:
1. An OLED display for producing a multicolor image, comprising:
  a) a plurality of pixels including three different colored addressable gamut-pixels and a fourth addressable within-gamut-pixel, each pixel having a separately addressable organic light-emitting diode with first and second electrodes and one or more organic light emissive layers provided between the electrodes;
  b) active matrix circuitry including a separate power transistor for at least two of the three different colored addressable gamut-pixels for regulating current between a first and second voltage source through the organic light-emitting diode of the colored addressable gamut-pixel; and
  c) the active matrix circuitry including a power transistor for the fourth addressable within-gamut-pixel for regulating current between a third and fourth voltage source through the organic light-emitting diode of the fourth addressable within-gamut-pixel wherein at least three of the first, second, third, and fourth voltage sources provide different voltage levels.

2. An OLED display for producing a multicolor image, comprising:
  a) a plurality of pixels including three different colored addressable gamut-pixels and a fourth addressable within-gamut-pixel, each pixel having a separately addressable organic light-emitting diode with first and second electrodes and one or more organic light emissive layers provided between the electrodes;
  b) active matrix circuitry including a separate power transistor for at least two of the three different colored addressable gamut-pixels for regulating current between a first and second voltage source through the organic light-emitting diode of the colored addressable gamut-pixel;
  c) the active matrix circuitry including a power transistor for the fourth addressable within-gamut-pixel for regulating current between a third and fourth voltage source through the organic light-emitting diode of the fourth addressable within-gamut-pixel; and
  d) wherein the magnitude of the difference between the voltage levels of the third and fourth voltage sources is less than the magnitude of the difference between the voltage levels of the first and second voltage sources.

3. The OLED display of claim 2 wherein the three different colored addressable gamut-pixels respectively produce red, green, and blue light and the fourth addressable within-gamut-pixel produces white light.

4. The OLED display of claim 2 wherein the active matrix circuitry includes a separate power transistor for the three different colored addressable gamut-pixels for regulating current between the first and second voltage source through the organic light-emitting diode of the colored addressable gamut-pixel.

5. The OLED display of claim 2 wherein the second and fourth voltage sources are the same.

6. The OLED display of claim 2 wherein a power line is associated with the power transistor of each different colored addressable gamut-pixel to provide current from the first voltage source through the power transistor and into the corresponding organic light-emitting diode to the second voltage source.

7. The OLED display of claim 6 wherein the power lines associated with the power transistor of each of the different colored addressable gamut-pixels are connected together.

8. The OLED display of claim 6 wherein the power lines associated with the power transistor of the different colored addressable gamut-pixels are connected together on one side of the display.

9. The OLED display of claim 2 wherein a power line is associated with the power transistor of the fourth addressable within-gamut-pixel to provide current from the third voltage source through the power transistor and into the corresponding organic light-emitting diode to the fourth voltage source.

10. The OLED display of claim 9 further including a plurality of fourth addressable within-gamut-pixels and each of the power lines associated with the plurality of fourth addressable within-gamut-pixels are connected together.

11. The OLED display of claim 9 further including a plurality of fourth addressable within-gamut-pixels and each of the power lines associated with the plurality of fourth addressable within-gamut-pixels are connected together on one side of the display.

12. An OLED display for producing a multicolor image, comprising:
  a) a plurality of pixels including three different colored addressable gamut-pixels and a fourth addressable within-gamut-pixel, each pixel having a separately addressable organic light-emitting diode with first and second electrodes and one or more organic light emissive layers provided between the electrodes;
  b) active matrix circuitry including a separate power transistor for at least two of the three different colored addressable gamut-pixels for regulating current through the organic light-emitting diode of the colored addressable gamut-pixel wherein the power transistors of the at least two of the three different colored addressable gamut-pixels each have a channel region having a first channel width to channel length ratio; and c) the active matrix circuitry including a power transistor for the fourth addressable within-gamut-pixel for regulating current through the organic light-emitting diode of the fourth addressable within-gamut-pixel wherein the power transistor of the fourth addressable within-gamut-pixel has a channel region having a second channel width to channel length ratio and wherein the first and second channel width to channel length ratios are different.

13. The OLED display of claim 12 wherein the first channel width to channel length ratio is greater than the second channel width to channel length ratio.

14. The OLED display of claim 12 wherein the active matrix circuitry includes a separate power transistor for all of the three different colored addressable gamut-pixels for regulating current through the organic light-emitting diode of the colored addressable gamut-pixel wherein all of the separate power transistors of the three different colored addressable gamut-pixels each have a channel region having the same channel width to channel length ratio.

15. The OLED display of claim 12 wherein the separate power transistors for at least two of the three different colored addressable gamut-pixels regulate current between a first and second voltage source through the organic light-emitting diode of the colored addressable gamut-pixel and the power transistor for the fourth addressable within-gamut-pixel regulates current between a third and fourth voltage source through the organic light-emitting diode of the fourth addressable within-gamut-pixel and magnitude of the difference between the voltage levels of the third and fourth voltage sources is less than the magnitude of the difference between the voltage levels of the first and second voltage sources.

16. The OLED display of claim 15 wherein the second and fourth voltage sources are the same.

17. The OLED display of claim 12 wherein the three different colored addressable gamut-pixels respectively produce red, green, and blue light and the fourth addressable within-gamut-pixel produces white light.

* * * * *